(12) United States Patent  
Kek

(10) Patent No.: US 6,861,733 B2
(45) Date of Patent: Mar. 1, 2005

(54) LEAD FRAME WIRE BONDING CLAMP MEMBER

(75) Inventor: Theng-Hui Kek, Singapore (SG)

(73) Assignee: Agilent Technologies, Inc., Palo Alto, CA (US)

( * ) Notice: Subject to any disclaimer, the term of this patent is extended or adjusted under 35 U.S.C. 154(b) by 22 days.

(21) Appl. No.: 10/349,598

(22) Filed: Jan. 22, 2003

(65) Prior Publication Data

US 2004/0140540 A1 Jul. 22, 2004

(51) Int. Cl.⁷ ............................................. H01L 23/495
(52) U.S. Cl. ..................................... 257/666; 257/727
(58) Field of Search ................................. 257/666, 676, 257/726, 727

(56) References Cited

U.S. PATENT DOCUMENTS

| 5,035,034 A | 7/1991 | Cotney |
| 6,062,459 A | 5/2000 | Sabyeying |
| 6,478,211 B2 * | 11/2002 | Ball et al. ............... 228/4.5 |

* cited by examiner

*Primary Examiner*—Roy Potter

(57) ABSTRACT

A clamp member or device includes a clamping portion with a rigid portion from which extend a number of independently flexible clamp fingers for contacting and clamping lead frame leads. The flexible clamp fingers have pivot points for pivoting about. The pivot points are provided integrally with the rigid portion of the clamping portion so that the fingers can flex independently of each other. The member is made from a single piece of machined steel.

13 Claims, 2 Drawing Sheets

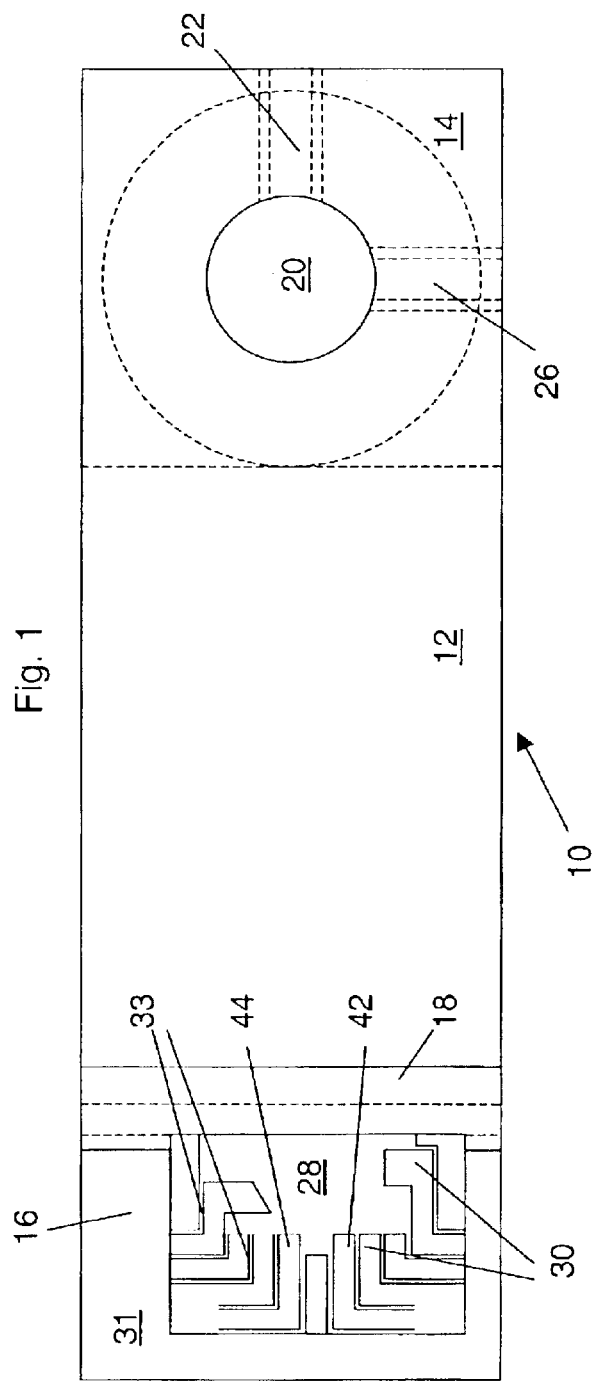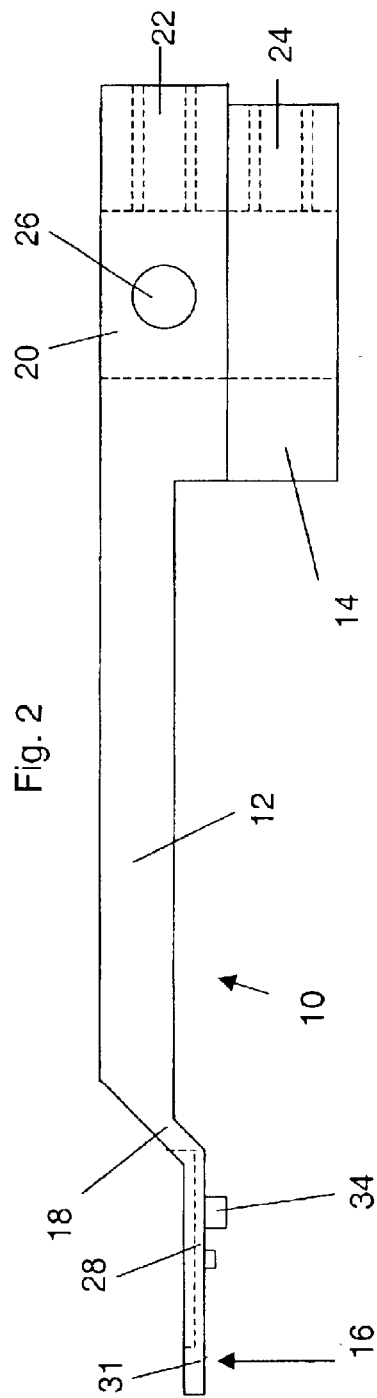

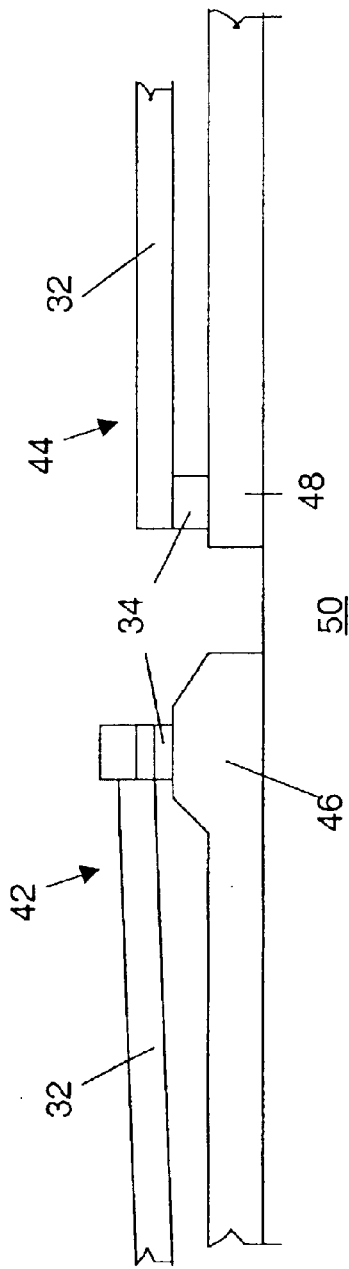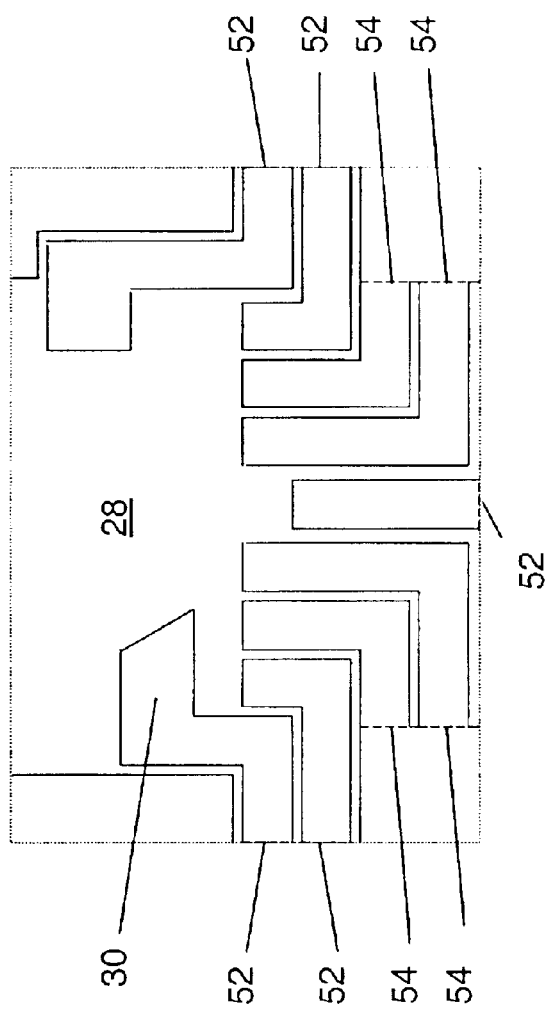

LEAD FRAME WIRE BONDING CLAMP MEMBER

FIELD OF THE INVENTION

The invention relates to a lead frame clamp member for use in the manufacture of semiconductor devices. More particularly, it relates to a clamp member for clamping lead frames in the wire bonding process, where bond wires are attached to lead frames to connect them electrically to bond pads of a semiconductor device.

BACKGROUND TO THE INVENTION

A semiconductor device typically includes a semiconductor chip that is mounted on a die attach pad of a lead frame, the lead frame having a number of leads that extend inwards from its edges. During fabrication of the semiconductor device, electrical connections are established between bond pads on the semiconductor chip and predetermined ones of those leads. This is achieved through a wire bonding process in which one end of a wire is attached to each bond pad of the semiconductor chip and the other end of the wire to a point on the appropriate lead. There are several wire bonding techniques available in the industry, for instance ultrasonic bonding and thermosonic (combined ultrasonics and thermocompression) bonding, whereby the wire is welded to the appropriate bond pads and leads.

The lead frame is typically made from a stamped metal sheet and is usually produced in a strip or ribbon where leads of a particular configuration are repeated throughout the whole length of the lead frame strip. During the wire bonding process, strips of lead frames, in which the semiconductor chips are already mounted, are loaded into a magazine in a wire bonding apparatus. They are taken out of the magazine and positioned for wire bonding to take place in each lead frame. After the wire bonding process has been completed, the semiconductor devices are sent for further processing and packaging.

The wire used is usually of a small diameter and has to be electrically conductive. Generally, most wires used for bonding are typically made of gold, aluminum alloy or copper. A clamping device is typically employed to hold the lead frame, more particularly to hold the leads of the lead frame down against a heater plate as the wire bonding process takes place. This is to ensure correct placement and efficient heat transfer. The structure of such clamps varies, but they include a surface or bodies to hold down the leads.

For instance, the clamp member may have a rigid body with a hole through it and a ridge, extending below the main surface of the body, around the edge of the hole. The hole allows clearance for the semiconductor chip and access for the bonding machine. The ridge holds down the leads in position. In other designs, the ridges may be replaced with rigid downward protrusions.

The wire used in wire bonding is usually of a small diameter. The bond pads are small and the leads are small. Everything has to be positioned accurately.

Unfortunately, this conventional approach fails to take into account variations in thicknesses and widths and positions due to manufacturing tolerances, for instance variations in lead thickness, variations that accumulate when the various clamping parts are assembled and used (i.e. from the clamp post, clamp post holder, heater plate, clamp, lead frame, etc.). Also it takes no account of variations introduced by repeated use of the clamp. These are the result of wear and tear and also deformation resulting from repeated heating and cooling cycles. In order to be able to achieve optimal clamping of the leads to overcome fabrication tolerances, the clamp member has to be offset by manually filing the clamp member in various areas. This is extremely time consuming and may take from hours to days depending on the complexity of the problem. Even then, quite soon such a clamp member would be rendered almost ineffective and the quality of the wire bonds would suffer.

One prior variation of the above mentioned conventional approach of employing a clamping device to hold the lead frame is to use clamping inserts, with ridges around holes and pivotally mounted in a clamping frame on leaf springs. The frame is supported at both ends. This approach at least tries to overcome the problem of deformities in the frame, but does not allow for variations in the thickness of the leads.

Another prior approach uses a clamp frame, which is supported at both ends with interchangeable clamp inserts. One such insert includes a round hole into which a number of identical spring-like fingers are radially directed at equal spacings. These are also directed downwards (at an angle of between 30 and 45 degrees and always less than 90 degrees) below the level of the frame and rest of the insert. The apparent intent is for each lead to be clamped independently and uniformly.

Such clamp inserts, however, tend to be thin and are difficult to manufacture evenly. Moreover, they deform upon tightening onto the frame. Shims then have to be inserted between the insert and the holder to compensate for the differences. This is a tedious optimizing process that may take days. Further, with a thin structure such as this, movement of one finger affects the others and hence the fingers cannot move independently. Additionally, the structure adds to the thickness of the clamp.

Another problem with this approach is the uniformity of the fingers. The ideal point of clamping for leads around a chip is not always exactly the same distance away from the center of the chip. Indeed, the leads usually have a rectangular arrangement. Sometimes the clamping point will be too far away from the ideal point. Sometimes a finger will fall between two leads and clamp neither satisfactorily, possibly even leading to deformation of a lead.

In view of the foregoing, it is desired to produce a new clamp, preferably a new one that avoids or at least partially alleviates at least some of the above problems.

SUMMARY OF THE INVENTION

One aspect of the present invention is to provide a clamp device that allows for independent adjustment.

Another aspect of the present invention is to a clamp device that does not cause deformities in the lead frames it holds, while allowing for variations in the thickness of the leads.

In accordance with one embodiment of the present invention, a clamp device or member for clamping leads of a semiconductor device lead frame is provided. The clamp member includes a clamping portion with a rigid portion from which extend a number of independently flexible clamp fingers for contacting and clamping lead frame leads. The flexible clamp fingers have pivot points for pivoting about. The pivot points are provided integrally with the rigid portion of the clamping portion.

BRIEF DESCRIPTION OF THE DRAWINGS

FIG. 1 is a top view of a lead frame clamp member in accordance with one embodiment of the invention.

FIG. 2 is a side view of the lead frame clamp member of FIG. 1.

FIG. 3 is a simplified view of clamp fingers of the clamp member of FIG. 1 contacting a lead frame.

FIG. 4 is an enlarged and sideways view of the recessed chip clearance hole of the embodiment illustrated in FIG. 1.

DETAILED DESCRIPTION

FIG. 1 shows a top view of an exemplary lead frame clamp member 10 in accordance with one embodiment of the invention. The clamp member 10 is elongate and generally rectangular in form, viewed from above. FIG. 2 shows the same clamp member 10, viewed from one side. It includes a flat plate middle portion 12, a thicker, mounting portion 14 at one end (the mounting end), and a thinner clamping portion 16 at the other end (the clamping end). The clamping portion 16 is generally flat and runs parallel to the middle portion 12, but in a different plane, slightly below that of the middle portion 12. A diagonally extending linking portion 18 links the clamping portion 16 and the middle portion 12.

A mounting hole 20 extends through the mounting portion 14, running perpendicular to the planes of the clamping portion 16 and the middle portion 12. The mounting hole 20 extends all the way through the mounting portion 14. In use the clamp member 10 is mounted on a clamp post (not shown), which is attached to a wire bonding machine, with the clamp post inserted into the mounting hole 20. Three screw holes 22, 24, 26 extend into the mounting hole 20 from the sides of the mounting portion 14. Two end holes 22, 24 extend from an end face of the clamp member 10, one above the other, and a side hole 26 extends perpendicular to the end holes 22, 24, at the same level as the topmost end hole 22 from a side face. Screws (not shown) in the three screw holes 22, 24, 26 are used to fix the clamp member 10 to a clamp post in the mounting hole 20. Holes 22 and 24 are to ensure perpendicularity on the post. Hole 26 is to prevent rotation during operation.

When the clamp member 10 is mounted on a clamp post, movement of the clamp post relative to the heater plate (not shown) is transmitted to the clamp member 10. Thus when the clamp post moves down relative to the heater plate in a wire bonding machine, the clamp member 10 moves down with it to clamp a lead frame and when the clamp post moves up relative to the heater plate in a wire bonding machine, the clamp member 10 moves up with it to release a lead frame.

The clamping portion 16 at the other end from the mounting portion 14 has a recessed chip clearance hole 28. A number of clamp fingers 30 extend into the chip clearance hole 28 from its edges. Chip clearance hole 28 gives clearance to a chip in the lead frame and allows access to the wire bonding arm of a wire bonding machine during wire bonding. The chip clearance hole 28 is recessed from above, so that the clamp fingers 30 (and any other part of the clamping portion 16) are generally thinner than the ridge portion 31 which is the rest of the clamping portion 16 outside the recessed hole 28. The thinning of the fingers and the gaps between them leads to the clamp fingers 30 being flexible relative to the rigid surrounding ridge portion 31.

In this example, some of the fingers end at the edge of the recessed area of the chip clearance hole 28, whilst others end away from the edge. It might be preferable for the recess area to follow the positions of the fingers, but this would be more costly.

FIG. 1 shows an example of a configuration of clamp fingers 30 for a specific product. The fingers are separated from each other by slits 33. The lengths of the slits 33 (and the length of the finger) are controlled to produce the desired flexibility. The length, thickness and other dimensions can vary with designs, as long the flexibility of the fingers is attained, whilst sufficient rigidity of the support is retained. The clamp fingers 30 extend into the chip clearance hole 28, one finger 30 for one lead. Each clamp finger 30 has a main portion 32, the bottom surface of which is in the same plane as most of the rest of the clamping portion 16, whilst the top surface is parallel to the plane of the top of the ridge portion of the clamping portion 16, but is recessed below it. However, they end in a short end portion 34, extending downwards, substantially perpendicular to and below the main portion 32. The end portions 34 themselves can be of differing lengths to allow for leads at differing heights in the frames. The end portions 34, in use, contact and hold down the leads.

The clamp fingers 30 are of various shapes and sizes to provide the desired pattern of end portions 34. Some fingers extend from lateral sides 36, 38 of the chip clearance hole 28, whilst others extend from end sides 40. Some of those extending from lateral sides 36, 38 start at different widths across the clamping portion 16. Thus the area of the chip clearance hole 28 not covered by fingers 30 is not necessarily rectangular or even regular. Likewise the area of the chip clearance hole 28, if the fingers 30 were removed, would not necessarily be rectangular or even regular.

Viewed from above, some of the clamp fingers 30 have just one, straight portion, some have two straight portions perpendicular to each other and some have three straight portions, two in parallel and one extending perpendicularly between them. Viewed from above, most fingers end square to last straight portion. However, some end at an angle according to the circumstances of the bonding tool and lead frame etc.

When a clamp member 10 is lowered towards the lead frame (or the heater plate is moved up, or both), the clamp fingers 30 come into positive contact with the respective leads that they are designed to hold and exert a clamping force on them. The clamping force keeps the leads in position while the wire bonding process takes place. Each finger is in contact with only one lead or other desired area, such as the die attach pad, depending on the product. The lengths of the fingers 30 and their intervening slits are such that the fingers 30 can flex slightly relative to and independently of each other.

The clamp member 10 here is a unitary component. The clamp member 10 is machined from a single piece of tool steel of, for example, XW-42, and hardness treated to, for example, 56–58 RC hardness, in order to improve its toughness and durability. However, the invention can encompass other materials that provide the same or similar properties, at least once processed and formed as a clamp member. The clamp fingers 30 are also machined from the same piece, by cutting suitably shaped slits.

FIG. 3 shows an exaggerated and simplified view of two clamp fingers 42, 44 when they are in contact with two leads 46, 48 of varying thickness, clamping them against a heater plate 50. One clamp finger 42 is in contact with a thicker lead 46 than the other one 44. As the fingers are not totally rigid, but can self-adjust to the inherent varying thickness of the lead frame, clamp finger 42 is bent more than the other clamp finger 44, which is in contact with a thinner lead 48. This results in more effective and even clamping of the leads. As finger 42 is made up of two perpendicular portions and both are bent, this results in the apparent misalignment in that finger shown in FIG. 3.

While FIG. 3 shows how the clamp member overcomes the problem of varying lead frame thickness, the independent flexibility of the fingers allows the clamp member of the invention to self adjust to negate most, if not all factors that tend to contribute to gaps between clamp fingers and leads and hence the heater plates. The invention thus allows each of the leads to be fully clamped while they are being wire-bonded. With effective clamping, the movement of the leads during wire bonding is greatly minimized or eliminated. This enables more precise bonding and allows efficient transfer of the bonding energy to the bond wire and bond pad. As such the resulting bonds will have improved mechanical integrity.

Thus in summary, the above clamp member is made from a single piece of machined steel and has a mounting hole at one end for mounting it on a clamp post. A number of independently flexible clamp fingers extend from a rigid body into an aperture at the other end. The fingers have pivot points that are integral with the rigid support around the aperture to ensure that the fingers can flex independently of each other.

The invention uses independently flexible fingers. This is achieved through independent pivot points for the fingers, that is the point about which a finger pivots during clamping. The pivot points for the illustrated embodiment are shown in FIG. 4, which is an enlarged and sideways view of the recessed chip clearance hole 28. For those fingers which terminate at the boundary with the edge of the hole 28, that is the rigid ridge portion 31, the pivot point 52 is the termination point. For those fingers which terminate within the hole 28, the pivot point 54 is where the shortest cut is (that is starting from the free end of a finger, the point where the finger is no longer separated from its neighbor on both sides). The independence of the pivot points is achieved primarily through the presence of a rigid body in the clamping portion 16, in this example the ridge portion 31, with which the pivot points are integrally provided, that is they are effectively a single piece of metal rather than being separate pieces mounted together. Preferably they are the same piece of metal, rather than just effectively so (e.g. through welding). Independence is also better for those fingers where the pivot point 52 is at the boundary with the rigid portion. This is aided by misaligning the pivot points, so that they are not all in a straight line and, if possible, not even in an ellipse (including a circle). Thus misalignment of pivot points can be achieved by varying the shapes of the fingers and lengths of slits.

It will be understood that most of the structure of the above example can be changed without departing from the scope of the invention. For example, the number, position and shape of the clamp fingers 30 can vary according to the configuration of the leads on the lead frame to be clamped, or according to various other requirements or preferences. The fingers 30 can be any desired shape, straight or curved of any number of portions, extending from any side, as appropriate. Likewise the size and shape of the chip clearance hole 28 can vary according to the circumstances. In the above embodiment it is a closed hole, however, it does not need to be, as long as the support for the fingers is sufficiently rigid.

The shape of the clamp member 10 and each component portion can also be changed as required. The above described embodiment is intended for support at just one end, on a clamp post. Other single ended support possibilities exist. Additionally, other embodiments, at least within some aspects of the invention can be intended for double ended support. In such an instance, for example, both ends might be mounting portions with a clamping portion in between them. Other mounting possibilities are also available as required by the configuration of the relevant clamp assembly or wire bonding machine.

The clamp member of the invention is easy to fit and use. It provides as improved means of clamping the leads of a semiconductor device lead frame during the wire bonding process by providing efficient clamping of the individual leads. It also improves the durability of the clamp member. The clamp fingers are fabricated such that they move independently of each other to self-adjust and accommodate the varying thicknesses of the lead frame or other variations that may lead to gaps between clamp fingers and leads and hence the heater plates. The clamp can be replaced with another of a different configuration of clamp fingers with relative ease and speed on a support structure e.g. a clamp post that has already been aligned to the wire bonding apparatus.

Many other variations are possible within the scope of the present invention which is only limited as defined in the claims or elsewhere as indicated.

What is claimed is:

1. A clamp member for clamping leads of a semiconductor device lead fame, comprising: a clamping portion having a rigid portion and a plurality of independently flexible clamp fingers extending from the rigid portion for contacting and clamping said leads, wherein the flexible clamp fingers have pivot points for pivoting about and adjusting to clamp leads of varying thicknesses, which are provided integrally with the rigid portion.

2. A clamp member according to claim 1, wherein the rigid portion and pivot points are provided in a unitary piece of metal.

3. A clamp member according to claim 1, wherein the flexible clamp fingers and pivot points are provided integrally with the rigid portion.

4. A clamp member according to claim 1, wherein the rigid portion is thicker than the fingers.

5. A clamp member according to claim 4, wherein the fingers are provided in a recess in the clamping portion, which is edged by the rigid portion.

6. A clamp member according to claim 1, wherein the termination point of each of one or more of the plurality of fingers, where the one or more fingers terminate, is at the rigid portion, and coincides with the pivot point for said one or more fingers.

7. A clamp member for clamping leads of a semiconductor device lead frame, comprising a clamping portion having a rigid portion and plurality of independently flexible clamp fingers extending from the rigid portion for contacting and clamping said leads, wherein the flexible clamp fingers have pivot points for pivoting about, which are provided integrally with the rigid portion, wherein the pivot points are misaligned.

8. A clamp member according to claim 7, wherein said plurality of clamp fingers comprises at least three clamp fingers and the pivot points of no three adjacent clamp fingers lie in a straight line.

9. A clamp member according to claim 7, wherein the pivot points do not all lie on an ellipse.

10. A clamp member according to claim 7, wherein said fingers are of varying sizes and shapes.

11. A clamp member according to claim 1, wherein at least one of said fingers is bent along its length.

12. A clamp member according to claim 1, wherein said fingers extend in the same plane or at least the majority of their lengths, each with a lead contact portion extending out of said plane at its end, with individual lead contact portions extending different amounts out of said plane.

13. A clamp member according to claim 1, further comprising mounting means connected to the clamping portion for securing the clamp member to support structure.

* * * * *